US012211909B2

(12) United States Patent
Lin et al.

(10) Patent No.: US 12,211,909 B2
(45) Date of Patent: Jan. 28, 2025

(54) LATERAL DOUBLE DIFFUSED MOS DEVICE

(71) Applicant: NuVolta Technologies (Hefei) Co., Ltd., Hefei (CN)

(72) Inventors: John Lin, Carlsbad, CA (US); Jinbiao Huang, Nashua, NH (US); Xintao Wang, Pleasanton, CA (US)

(73) Assignee: NuVolta Technologies (Hefei) Co., Ltd., Hefei (CN)

( * ) Notice: Subject to any disclaimer, the term of this patent is extended or adjusted under 35 U.S.C. 154(b) by 357 days.

(21) Appl. No.: 17/648,465

(22) Filed: Jan. 20, 2022

(65) Prior Publication Data
US 2022/0262907 A1 Aug. 18, 2022

Related U.S. Application Data

(60) Provisional application No. 63/148,760, filed on Feb. 12, 2021.

(51) Int. Cl.
| | |
|---|---|
| *H01L 29/40* | (2006.01) |
| *H01L 23/528* | (2006.01) |
| *H01L 29/417* | (2006.01) |
| *H01L 29/66* | (2006.01) |
| *H01L 29/78* | (2006.01) |
| *H01L 23/522* | (2006.01) |

(52) U.S. Cl.
CPC .......... *H01L 29/402* (2013.01); *H01L 23/528* (2013.01); *H01L 29/401* (2013.01); *H01L 29/66681* (2013.01); *H01L 29/7816* (2013.01); *H01L 23/5226* (2013.01); *H01L 29/41725* (2013.01)

(58) Field of Classification Search
CPC . H01L 23/528; H01L 23/5226; H01L 23/481; H01L 29/0696; H01L 29/402; H01L 29/401; H01L 29/7816; H01L 29/41725; H01L 29/0653
See application file for complete search history.

(56) References Cited

U.S. PATENT DOCUMENTS

| | | | |
|---|---|---|---|
| 6,346,451 B1* | 2/2002 | Simpson | H01L 29/42368 |
| | | | 257/E29.279 |
| 2011/0127586 A1* | 6/2011 | Bobde | H01L 29/7817 |
| | | | 438/192 |
| 2011/0127602 A1* | 6/2011 | Mallikarjunaswamy | ............ |
| | | | H01L 27/0617 |
| | | | 257/E29.256 |
| 2013/0181285 A1* | 7/2013 | Ng | H01L 29/0649 |
| | | | 257/E29.264 |

(Continued)

*Primary Examiner* — Galina G Yushina
(74) *Attorney, Agent, or Firm* — AP3 Law Firm PLLC

(57) ABSTRACT

An apparatus includes a substrate of a first conductivity, an extended drain region of a second conductivity formed over the substrate, a body region of the first conductivity formed in the extended drain region, a source region of the second conductivity formed in the body region, a drain region of the second conductivity formed in the extended drain region, a first dielectric layer formed over the body region and the extended drain region, a second dielectric layer formed over the extended drain region, and between the first dielectric layer and the drain region, a first gate formed over the first dielectric layer, and a second gate formed over the second dielectric layer, wherein the second gate is electrically connected to the source region.

11 Claims, 10 Drawing Sheets

(56) References Cited

U.S. PATENT DOCUMENTS

| 2017/0229570 A1* | 8/2017 | Cheng | H01L 29/7835 |
| 2017/0250277 A1* | 8/2017 | Wu | H01L 29/66681 |
| 2019/0280092 A1* | 9/2019 | Lin | H01L 29/408 |

* cited by examiner

LATERAL DOUBLE DIFFUSED MOS DEVICE

PRIORITY

This application claims the benefit of U.S. Provisional Application No. 63/148,760, filed on Feb. 12, 2021, entitled "Lateral Double Diffused MOS Device," which application is hereby incorporated herein by reference.

TECHNICAL FIELD

The present invention relates to a lateral double diffused MOS (LDMOS) device, and, in particular embodiments, to an LDMOS device including a split-gate structure.

BACKGROUND

As semiconductor technologies evolve, metal oxide semiconductor field effect transistors (MOSFET) have been widely used in integrated circuits. MOSFETs are voltage controlled devices. When a control voltage is applied to the gate of a MOSFET and the control voltage is greater than the threshold of the MOSFET, a conductive channel is established between the drain and the source of the MOSFET. After the conductive channel has been established, a current flows between the drain and the source of the MOSFET. On the other hand, when the control voltage applied to the gate is less than the threshold of the MOSFET, the MOSFET is turned off accordingly.

MOSFETs may include two major categories, namely n-channel MOSFETs and p-channel MOSFETs. According to the structure difference, MOSFETs can be further divided into three sub-categories, planar MOSFETs, lateral double-diffused MOS (LDMOS) devices and vertical double-diffused MOSFETs. In comparison with other MOSFETs, the LDMOS device is capable of delivering more current per unit area because the asymmetric structure of the LDMOS device provides a short channel between the drain and the source of the LDMOS. In order to further improve the performance of the LDMOS device, a lightly doped drift region is employed as a drain extension. Furthermore, the polysilicon gate of the LDMOS device is stretched beyond the channel region. More particularly, the polysilicon gate extends over a thick oxide layer to form a field plate to increase the breakdown voltage of the LDMOS device.

FIG. 1 illustrates a simplified cross-sectional view of an LDMOS device. The LDMOS device include a substrate 11, a buried layer 13, a drift layer 15 formed over the buried layer 13 and a body region 12. The LDMOS device further comprises a source region 14 and a body contact region 18 formed in the body region 12, a drain region 16 formed in the drift layer 15, a gate dielectric layer 34, a local oxidation of silicon (LOCOS) structure 32 and a gate 26. The LDMOS device further comprises a plurality of contacts including a source contact plug 41, a source contact 42, a gate contact plug 45, a gate contact 46, a drain contact plug 47 and a drain contact 48.

FIG. 2 illustrates a simplified top view of the LDMOS device shown in FIG. 1. The body contact region 18, the source region 14 and the drain region 16 are formed over the drift layer 15. The gate 26 is formed over the drift layer 15 and the LOCOS structure 32. The gate 26 is between the source region 14 and the drain region 16. A plurality of source contact plugs 41 is formed over the body contact region 18 and the source region 14. The plurality of source contact plugs 41 couples the body contact region 18 to the source region 14. The source contact 42 is formed over the plurality of source contact plugs 41. As shown in FIG. 2, the source contact 42 is a metal plane. A plurality of drain contact plugs 47 is formed over the drain region 16. The drain contact 48 is formed over the plurality of drain contact plugs 47. As shown in FIG. 2, the drain contact 48 is a metal plane. A gate contact plugs 45 is formed over the gate 26. The gate contact 46 is formed over the gate contact plug 45. As shown in FIG. 2, the gate contact 46 is a metal plane.

The drawback of the LDMOS device shown in FIGS. 1-2 is the overlap of the gate with the drift region may increase the gate-to-drain capacitance. The extra gate-to-drain capacitance adversely affects the switching performance of the LDMOS device. It is desirable to reduce the gate-to-drain capacitance of the LDMOS device so as to improve efficiency.

SUMMARY

These and other problems are generally solved or circumvented, and technical advantages are generally achieved, by preferred embodiments of the present disclosure which provide an LDMOS device including a split-gate structure.

In accordance with an embodiment, an apparatus comprises a substrate of a first conductivity, an extended drain region of a second conductivity formed over the substrate, a body region of the first conductivity formed in the extended drain region, a source region of the second conductivity formed in the body region, a drain region of the second conductivity formed in the extended drain region, a first dielectric layer formed over the body region and the extended drain region, a second dielectric layer formed over the extended drain region, and between the first dielectric layer and the drain region, a first gate formed over the first dielectric layer, and a second gate formed over the second dielectric layer, wherein the second gate is electrically connected to the source region.

In accordance with another embodiment, a method comprises growing an epitaxial layer with a second conductivity type on a substrate with a first conductivity type, forming a drift layer having the second conductivity type over the epitaxial layer, forming a body region with the first conductivity type in the drift layer, implanting ions with the second conductivity type to form a source region in the body region and a drain region in the drift layer, forming a first dielectric layer over the body region and the drift layer, forming a second dielectric layer over the drift layer, and between the first dielectric layer and the drain region, forming a first gate over the first dielectric layer, and forming a second gate over the second dielectric layer, wherein the second gate is electrically connected to the source region.

In accordance with yet another embodiment, a device comprises a first drain/source region and a second drain/source region formed over a substrate, a dielectric region formed over the substrate and between the first drain/source region and the second drain/source region, and a first gate and a second gate formed over the dielectric region, wherein the first gate and the second gate are electrically isolated from each other, and one of the first gate and the second gate is electrically connected to the first drain/source region.

The foregoing has outlined rather broadly the features and technical advantages of the present disclosure in order that the detailed description of the disclosure that follows may be better understood. Additional features and advantages of the disclosure will be described hereinafter which form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

The present disclosure will be described with respect to embodiments in a specific context, a lateral double-diffused metal oxide semiconductor (LDMOS) device including a split-gate structure. The embodiments of the disclosure may also be applied, however, to a variety of metal oxide semiconductor field effect transistors (MOSFETs).

Figure 3:
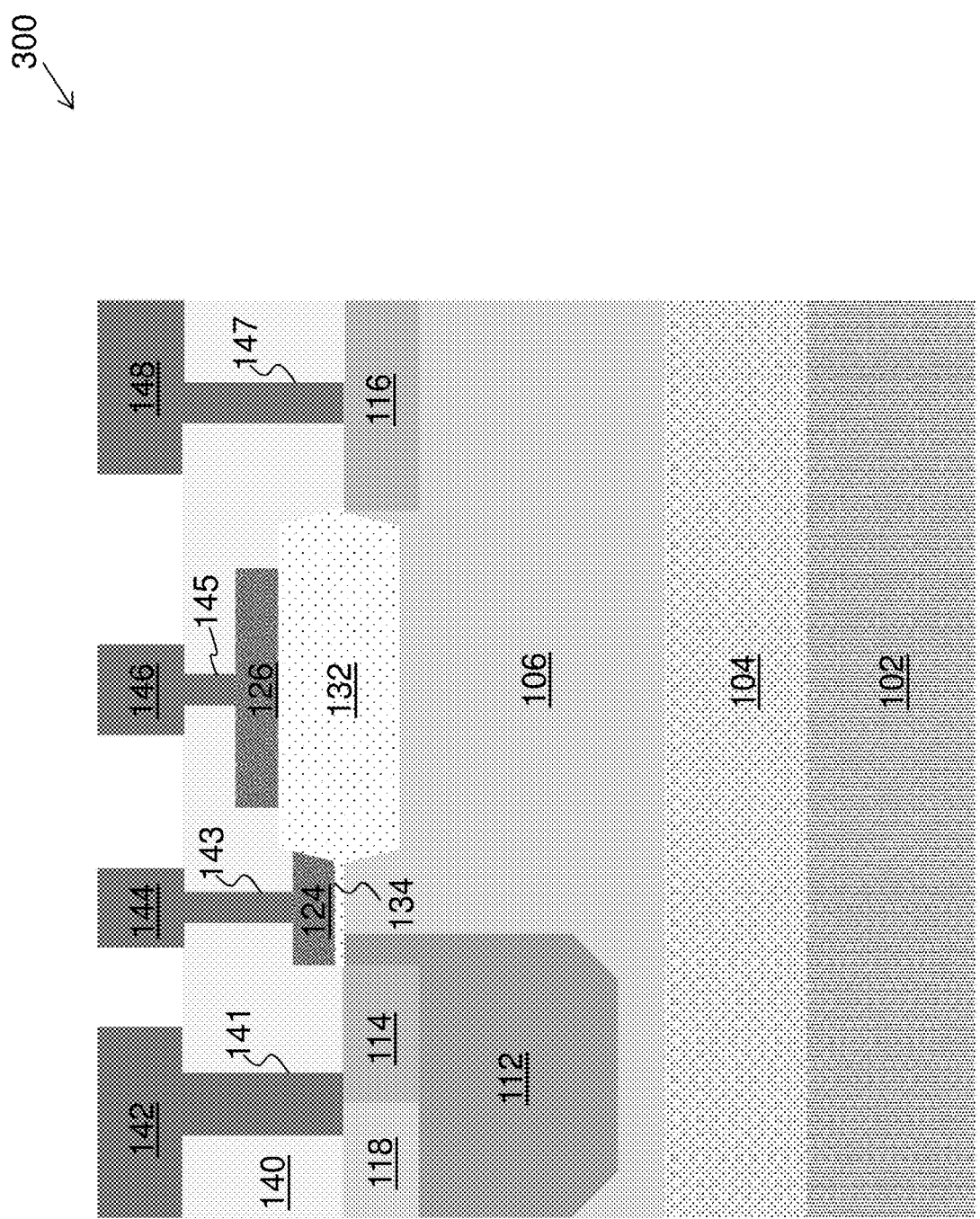
FIG. 3 illustrates a simplified cross-sectional view of an LDMOS device having a split-gate structure in accordance with various embodiments of the present disclosure.

FIG. 3 illustrates a simplified cross-sectional view of an LDMOS device having a split-gate structure in accordance with various embodiments of the present disclosure. The LDMOS device 300 include a substrate 102, a first layer 104, a drift layer 106 formed over the first layer 104 and a body region 112. The LDMOS device 300 further comprises a first drain/source region 114 and a body contact region 118 formed in the body region 112, a second drain/source region 116 formed in the drift layer 106, a gate dielectric layer 134, a local oxidation of silicon (LOCOS) structure 132, a first gate 124 and a second gate 126. The LDMOS device 300 further comprises a plurality of contacts including a source contact plug 141, a source contact 142, a first gate contact plug 143, a first gate contact 144, a second gate contact plug 145, a second gate contact 146, a drain contact plug 147 and a drain contact 148.

In some embodiments, the substrate 102, the body region 112 and the body contact region 118 have a first conductivity type. The first layer 104, the drift layer 106, the first drain/source region 114 and the second drain/source region 116 have a second conductivity type. In some embodiments, the first conductivity type is p-type, and the second conductivity type is n-type. The LDMOS device 300 is an n-type transistor. Alternatively, the first conductivity type is n-type, and the second conductivity type is p-type. The LDMOS device 300 is a p-type transistor.

The substrate 102 may be formed of suitable semiconductor materials such as silicon, silicon germanium, silicon carbide and the like. Depending on different applications and design needs, the substrate 102 may be n-type or p-type. In some embodiments, the substrate 102 is a p-type substrate. Appropriate p-type dopants such as boron and the like are doped into the substrate 102. Alternatively, the substrate 102 is an n-type substrate. Appropriate n-type dopants such as phosphorous and the like are doped into the substrate 102.

The first layer 104 may comprise an epitaxial layer and a buried layer. In some embodiments, both the epitaxial layer and the buried layer are n-type layers. The n-type buried layer is formed between the substrate 102 and the n-type epitaxial layer. The n-type buried layer is deposited over the substrate 102 for isolation purposes. For example, the n-type buried layer is employed to prevent the current from flowing into the substrate 102, thereby avoiding the leakage in the LDMOS device 300. The n-type epitaxial layer is grown over the substrate 102. The epitaxial growth of the n-type epitaxial layer may be implemented by using any suitable semiconductor fabrication processes such as chemical vapor deposition (CVD) and the like. In some embodiments, the n-type epitaxial layer is of a doping density in a range from about $10^{14}/cm^3$ to about $10^{16}/cm^3$.

The drift layer 106 is an n-type layer formed over the first layer 104. In some embodiments, the drift layer 106 may be doped with an n-type dopant such as phosphorous to a doping density of about $10^{15}/cm^3$ to about $10^{17}/cm^3$. It should be noted that other n-type dopants such as arsenic, antimony, or the like, could alternatively be used. It should further be noted that throughout the description, the drift layer 106 may be alternatively referred to as an extended drain region.

The body region 112 is a p-type body region. The p-type body regions may be formed by implanting p-type doping materials such as boron and the like. Alternatively, the p-type body region can be formed by a diffusion process. In some embodiments, a p-type material such as boron may be implanted to a doping density of about $10^{16}/cm^3$ to about $10^{18}/cm^3$. The body region 112 may be alternatively referred to as a channel region.

The first drain/source region 114 is a first N+ region formed in the body region 112. The first drain/source region 114 may be alternatively referred to as the first N+ region 114. In accordance with an embodiment, the first N+ region 114 functions as a source region of the LDMOS device 300. The source region may be formed by implanting n-type dopants such as phosphorous and arsenic at a concentration of between about $10^{19}/cm^3$ and about $10^{20}/cm^3$. As shown in FIG. 3, the source contact plug 141 and the source contact 142 are formed over the first N+ region 114.

The body contact region 118 is a P+ region formed in the body region 112. The body contact region 118 may be alternatively referred to as the P+ region 118. As shown in FIG. 3, the P+ region 118 is formed immediately adjacent to the first N+ region 114 in the body region 112. The P+ region 118 may be formed by implanting a p-type dopant such as boron at a concentration of between about $10^{19}/cm^3$ and about $10^{20}/cm^3$. The P+ region 118 may contact the p-type body. In order to eliminate the body effect, the P+ region may be connected to the source region (the first N+ region 114) directly through the source contact plug 141.

The second drain/source region 116 is a second N+ region. The second drain/source region 116 may be alternatively referred to as the second N+ region 116. In accordance with an embodiment, the second N+ region 116 functions as a drain region of the LDMOS device 300. The second N+ region 116 may be formed by implanting n-type dopants such as phosphorous and arsenic at a concentration of between about $10^{19}/cm^3$ and about $10^{20}/cm^3$. As shown in FIG. 3, the drain contact plug 147 and the drain contact 148 are formed over the second N+ region 116.

The gate dielectric layer 134 is formed over the drift layer 106. The upper portion of the LOCOS structure 132 is over the drift layer 106. The lower portion of the LOCOS structure 132 extends into the drift layer 106. As shown in FIG. 3, the gate dielectric layer 134 is partially on top of the body region 112, and partially on top of the drift layer 106. The LOCOS structure 132 is formed between the gate dielectric layer 134 and the second N+ region 116.

As shown in FIG. 3, the thickness of the LOCOS structure 132 is much greater than the thickness of the gate dielectric layer 134. In some embodiments, the gate dielectric layer 134 is of a thickness of between about 100 Angstroms and about 200 Angstroms. The thickness of the LOCOS structure 132 is in a range from about 5000 Angstroms to about 10000 Angstroms. In some embodiments, the gate dielectric layer 134 and the LOCOS structure 132 may be formed of suitable oxide materials such as silicon oxide, silicon oxynitride, hafnium oxide, zirconium oxide or the like.

The first gate 124 is formed on the gate dielectric layer 133. The second gate 126 is formed on the LOCOS structure 132. As shown in FIG. 3, the first gate 124 covers a top surface of the gate dielectric layer 134 and a lower portion of a sidewall of the LOCOS structure 132. The second gate 126 partially covers a top surface of the LOCOS structure 132.

The second gate 126 is electrically connected to the source region of the LDMOS device 300 (the first N+ region 114). The detailed layout of the connection between the second gate 126 and the source region will be described below with respect to FIG. 4. The first gate 124 and the second gate 126 may be formed of polysilicon, polysilicon germanium, nickel silicide or other metal, metal alloy materials.

As shown in FIG. 3, the first gate 124 fully covers the channel region (the portion of the body region between the first N+ region 114 and the drift layer 106). The first gate 124 functions as a gate electrode configured to control the current flowing between the drain and source of the LDMOS device 300. The second gate 126 partially covers the top surface of the LOCOS structure 132. The second gate 126 and the LOCOS structure 132 form a field plate. This field plate helps to maintain the breakdown voltage of the LDMOS device 300.

Figure 1:
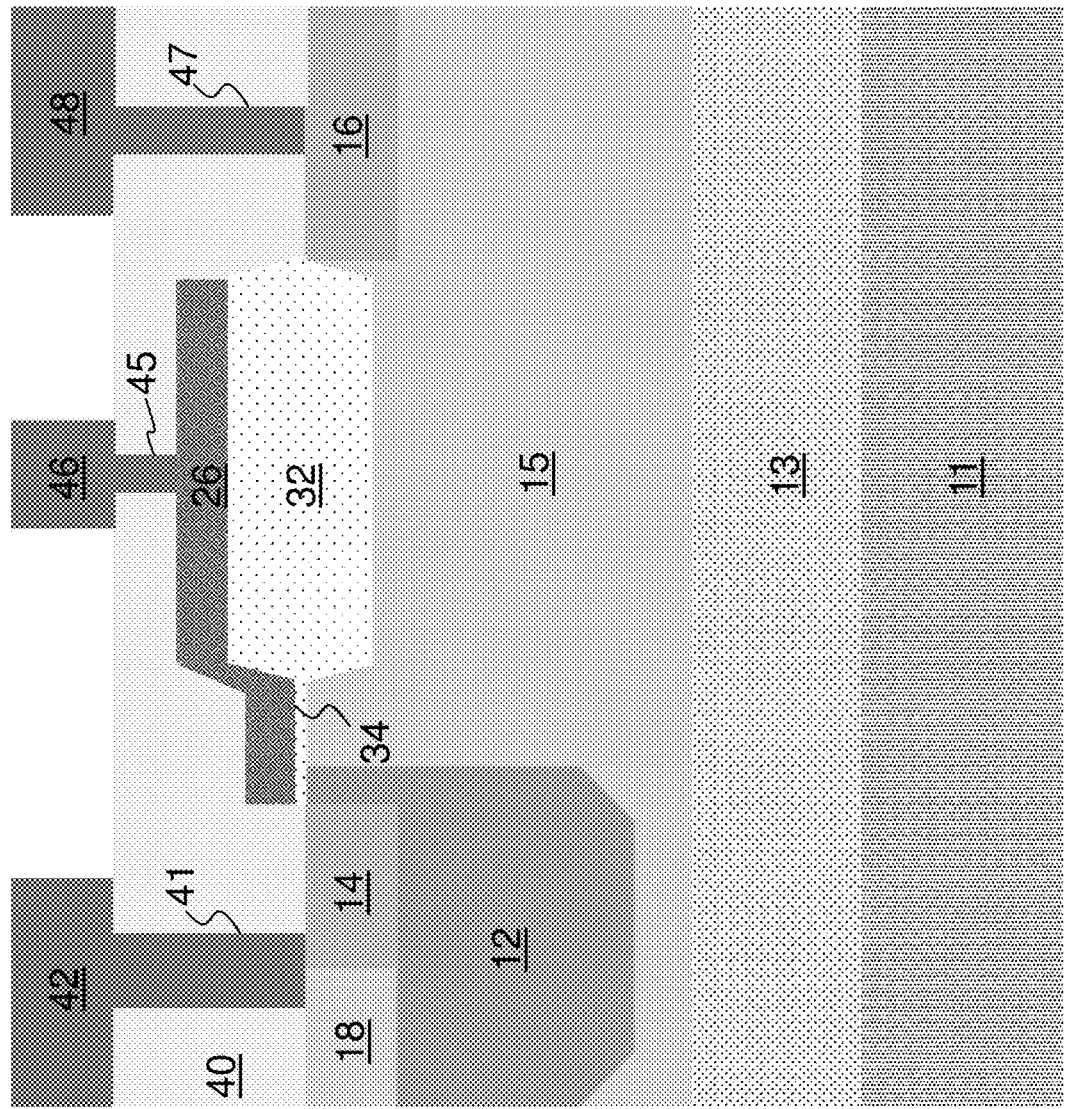
FIG. 1 illustrates a simplified cross-sectional view of an LDMOS device.
Figure 2:
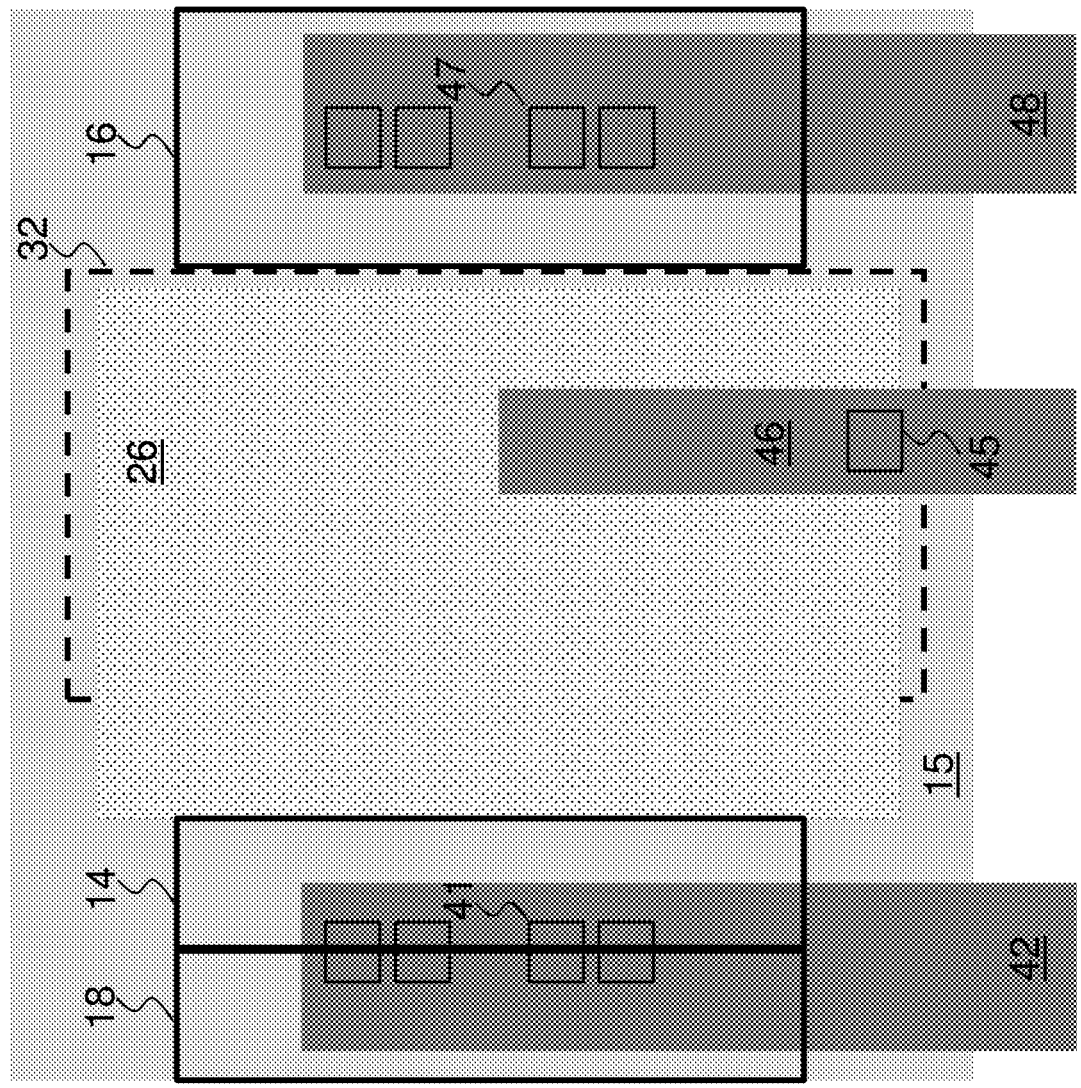
FIG. 2 illustrates a simplified top view of the LDMOS device shown in FIG. 1.

The first gate 124 and the second gate 126 form a split-gate structure. In comparison with a conventional LDMOS device having a gate extending over the LOCOS structure 132 (e.g., the LDMOS device shown in FIGS. 1-2), the split-gate structure helps to reduce the gate-to-drain overlap capacitance, thereby improving the switching performance of the LDMOS device 300.

The first gate 124 and the second gate 126 may be formed by depositing a polysilicon layer with a thickness of about 4000 Angstroms over the gate dielectric layers and the high voltage oxide region, depositing a photoresist layer over the polysilicon layer, developing the photoresist layer to define the first gate 124 and the second gate 126, etching the polysilicon layer to form the first gate 124 and the second gate 126.

As shown in FIG. 3, the first gate contact plug 143 and the second gate contact plug 145 are formed in a dielectric layer 140. The first gate contact 144 is connected to the first gate 124 through the first gate contact plug 143. The second gate contact 146 is connected to the second gate 126 through the second gate contact plug 145.

The dielectric layer 140 may be a low-k dielectric layer having a low dielectric constant. The dielectric layer 140 may also comprise a combination of materials such as silicon nitride, silicon oxy-nitride and the like. The dielectric layer 140 may be deposited using suitable deposition techniques such as sputtering, CVD and the like.

In some embodiments, an anisotropic etching process is applied to the dielectric layer 140 to form a plurality of openings. A suitable metal material is filled in the openings to form the contact plugs 141, 143, 145 and 147. The metal material may be copper, tungsten, titanium, aluminum, any combinations thereof and/or the like.

FIG. 3 shows an LDMOS device having a split-gate structure. In comparison with a conventional LDMOS device having a gate extending over the LOCOS structure (e.g., the LDMOS device shown in FIGS. 1-2), the split-gate structure is able to achieve better switching performance without degrading the breakdown voltage of the LDMOS device. Furthermore, the split-gate structure may reduce the total power losses of the LDMOS device. In particular, the field plate of the conventional LDMOS device may induce an accumulation layer in the drain extension after a positive gate voltage is applied to the gate of the conventional LDMOS device. The accumulation layer helps to lower the on resistance of the conventional LDMOS device. The split-gate structure shown in FIG. 3 cannot induce the accumulation layer because the second gate 126 is electrically connected to the source of the LDMOS device 300. The on resistance of the LDMOS device having a split-gate structure may increase slightly. For example, for a 30-V LDMOS device, the on resistance may increase by 10% after having the split-gate structure. However, the split-gate structure is able to reduce the gate charge, which helps to lower the total power losses of the LDMOS device. A figure of merit (FOM) is a widely used performance index for measuring the total power losses of LDMOS devices. FOM is the product of $R_{ON} \times Q_G$. $R_{ON}$ is the on resistance of an LDMOS device. $Q_G$ is the gate charge of the LDMOS device. By using the split-gate structure shown in FIG. 3, for a 30-V LDMOS device, the FOM of this 30-V LDMOS device is lowered from 145 mΩ-nC to 86 mΩ-nC. The FOM is reduced by 41%.

Figure 4:
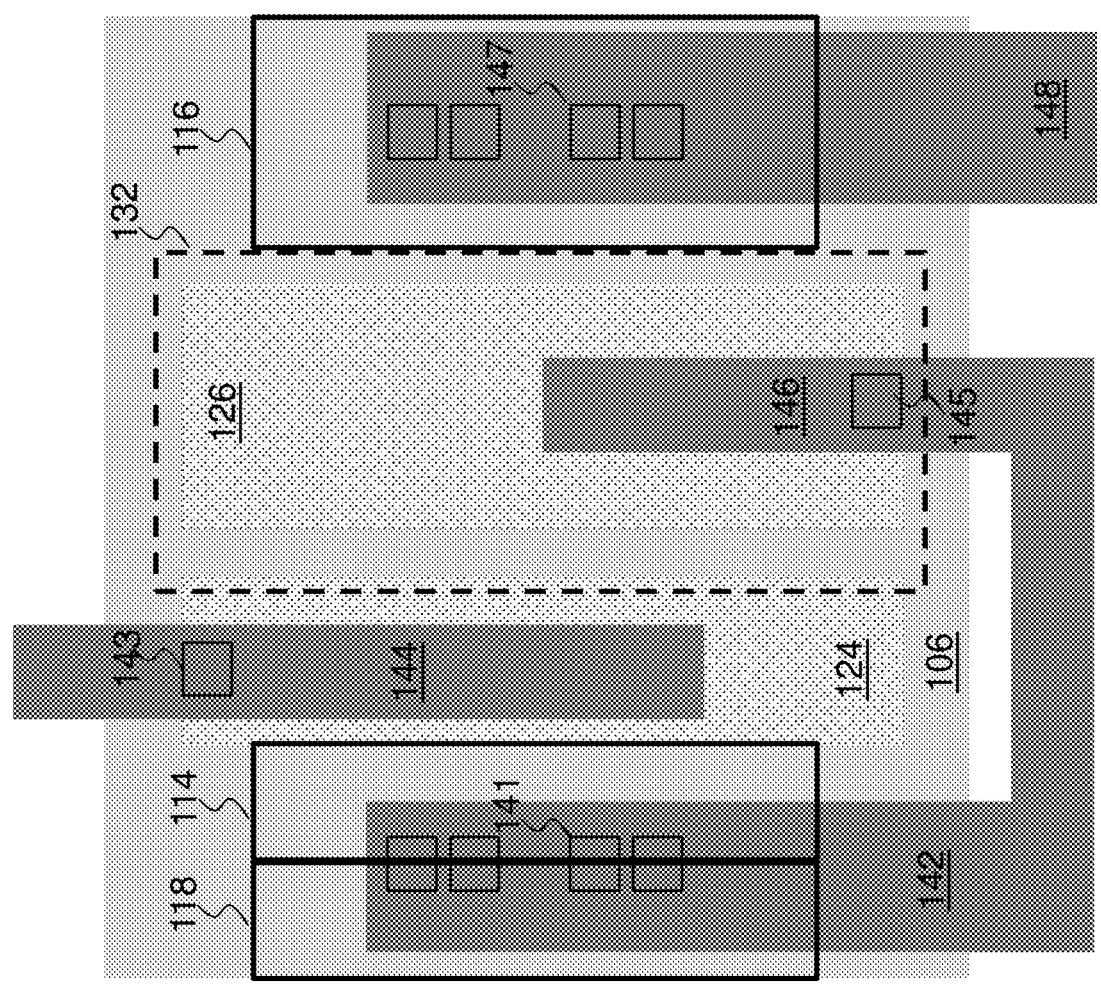
FIG. 4 illustrates a simplified top view of the LDMOS device shown in FIG. 3 in accordance with various embodiments of the present disclosure.

FIG. 4 illustrates a simplified top view of the LDMOS device shown in FIG. 3 in accordance with various embodiments of the present disclosure. The P+ region 118, the first N+ region 114 and the second N+ region 116 are formed over the drift layer 106. The first gate 124 and the second gate 126 are formed over the drift layer 106 and between the first N+ region 114 and the second N+ region 116. As shown in FIG. 4, there is a gap between the first gate 124 and the second gate 126.

A plurality of source contact plugs 141 is formed over the P+ region 118 and the first N+ region 114. The plurality of source contact plugs 141 couples the P+ region 118 to the first N+ region 114. The source contact 142 is formed over the plurality of source contact plugs 141. As shown in FIG. 4, the source contact 142 is a metal plane.

A plurality of drain contact plugs 147 is formed over the second N+ region 116. The drain contact 148 is formed over the plurality of drain contact plugs 147. As shown in FIG. 4, the drain contact 148 is a metal plane.

A first gate contact plug 143 is formed over the first gate 124. The first gate contact 144 is formed over the first gate contact plug 143. As shown in FIG. 4, the first gate contact 144 is a metal plane.

A second gate contact plugs 145 is formed over the second gate 126. The second gate contact 146 is formed over the second gate contact plug 145. As shown in FIG. 4, the second gate contact 146 is a metal plane.

As shown in FIG. 4, the metal plane of the second gate contact 146 is electrically connected to the metal plane of the source contact 142. Through this connection, the second gate 126 is electrically connected to the first N+ region 114.

The metal planes shown in FIG. 4 are substantially rectangular in shape. It is within the scope and spirit of the disclosure for the metal planes to comprise other shapes, such as, but not limited to oval, square, or circular.

Figure 5:
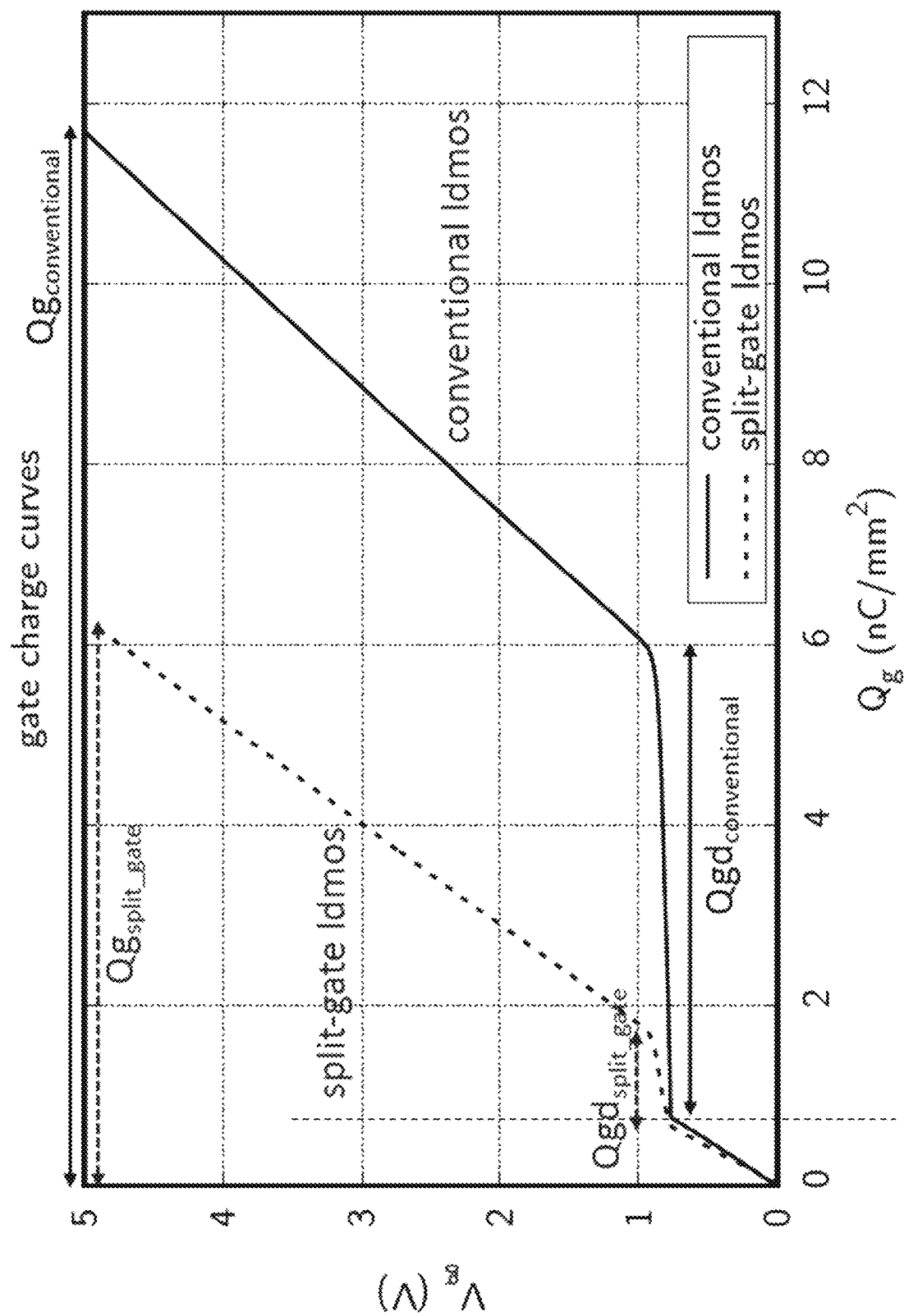
FIG. 5 illustrates a comparison between an LDMOS device having a split-gate structure and a conventional LDMOS device in accordance with various embodiments of the present disclosure.

FIG. 5 illustrates a comparison between an LDMOS device having a split-gate structure and a conventional LDMOS device in accordance with various embodiments of the present disclosure. The vertical axis represents the gate drive voltage (Vg). The horizontal axis represents the total gate charge (Qg). The total gate charge Qg is defined as the charge required for the gate of the LDMOS device to be charged from 0 V to the maximum gate voltage (e.g., 5 V).

As shown in FIG. 5, the solid line represents the gate charge profile of the conventional LDMOS device. The dashed line represents the gate charge profile of the LDMOS device having a split-gate structure. Before the start of the Miller Plateau (dashed line A shown in FIG. 5), the gate charge of the conventional LDMOS device (e.g., the LDMOS device shown in FIGS. 1-2) is approximately equal to the gate charge of the LDMOS device having a split-gate structure. $Qgd_{split\_gate}$ is the gate charge of the LDMOS device having a split-gate structure. As shown in FIG. 5, $Qgd_{split\_gate}$ is the gate charge from the start to the end of the Miller Plateau of the LDMOS device having a split-gate structure. $Qgd_{conventional}$ is the gate charge of the conventional LDMOS device. As shown in FIG. 5, $Qgd_{conventional}$ is the gate charge from the start to the end of the Miller Plateau of the conventional LDMOS device. As shown in FIG. 5, $Qgd_{conventional}$ is much greater than $Qgd_{split\_gate}$. The comparison between $Qgd_{split\_gate}$ and $Qgd_{conventional}$ indi- cates the split-gate structure helps to reduce the gate charge from the start to the end of the Miller Plateau of the LDMOS device.

$Qg_{split\_gate}$ is the gate charge of the LDMOS device having a split-gate structure. As shown in FIG. 5, $Qg_{split\_gate}$ is the gate charge from 0 V to the maximum gate drive voltage. $Qg_{conventional}$ is the gate charge of the conventional LDMOS device. As shown in FIG. 5, $Qg_{conventional}$ is the gate charge from 0 V to the maximum gate drive voltage. As shown in FIG. 5, $Qg_{conventional}$ is much greater than $Qg_{split\_gate}$. The comparison between $Qg_{split\_gate}$ and $Qg_{conventional}$ indicates the split-gate structure helps to reduce the gate charge from 0 V to the maximum gate drive voltage.

Figure 6:
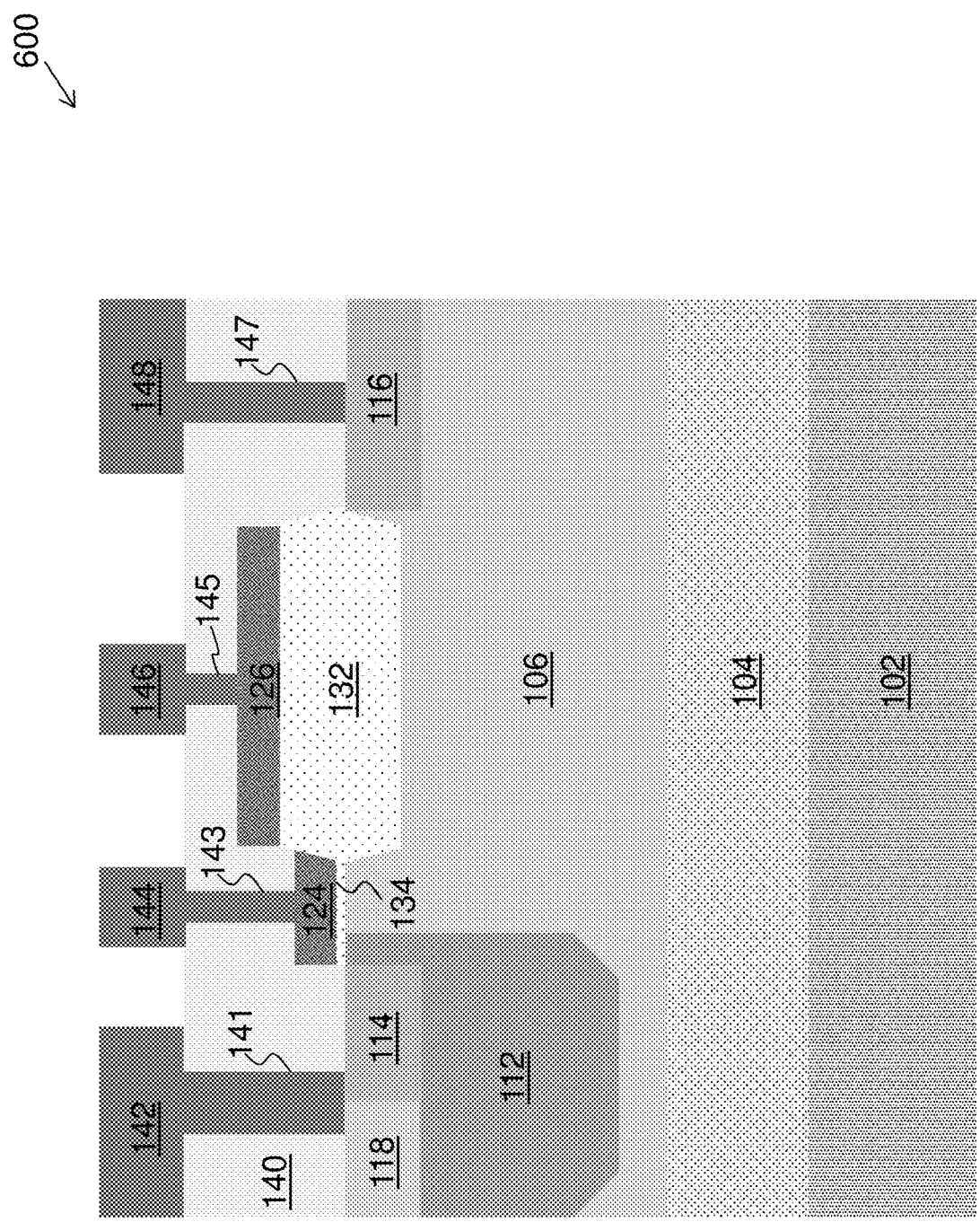
FIG. 6 illustrates a simplified cross-sectional view of another LDMOS device having a split-gate structure in accordance with various embodiments of the present disclosure.

FIG. 6 illustrates a simplified cross-sectional view of another LDMOS device having a split-gate structure in accordance with various embodiments of the present disclosure. The LDMOS device 600 shown in FIG. 6 is similar to the LDMOS device 300 shown in FIG. 3 except that the second gate 126 fully covers the top surface of the LOCOS structure 132. The operating principle of the LDMOS device 600 is similar to the operating principle of the LDMOS device 300, and hence is not discussed herein again.

Figure 7:
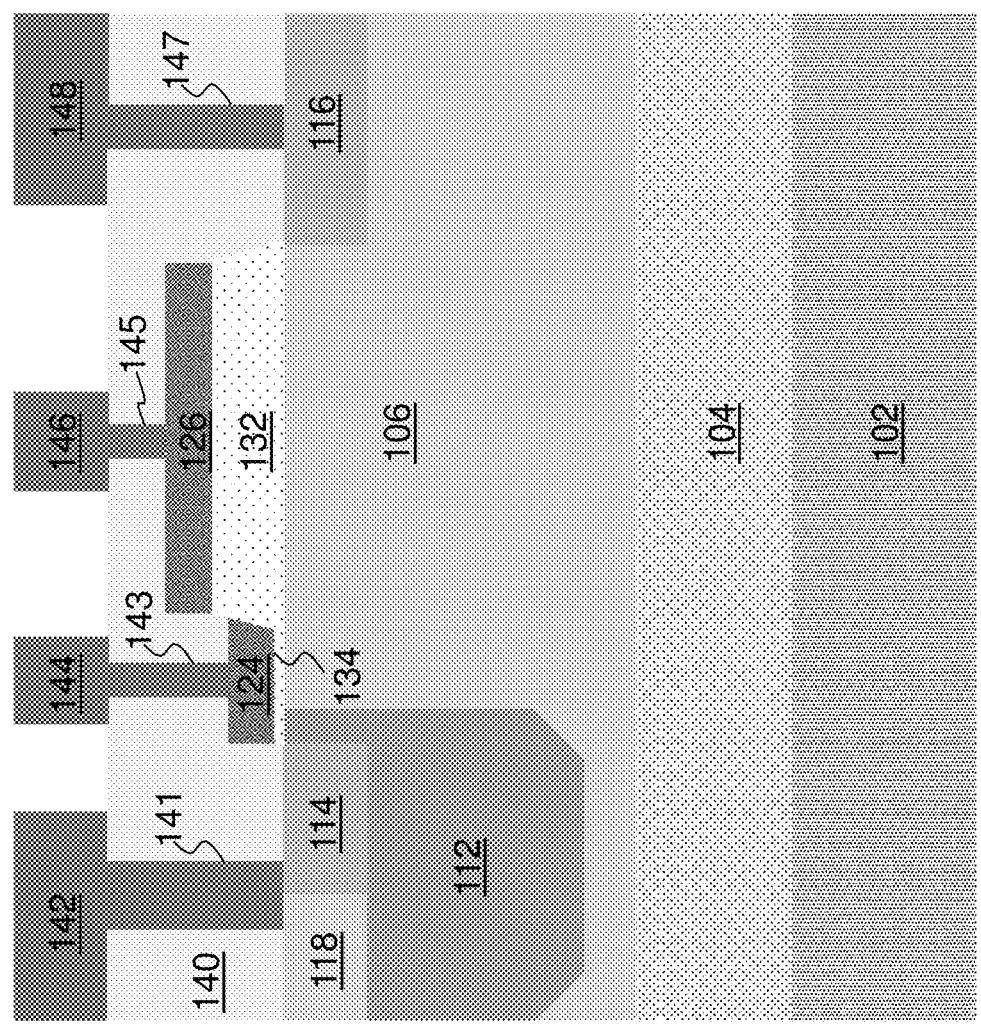
FIG. 7 illustrates a simplified cross-sectional view of another LDMOS device having a split-gate structure in accordance with various embodiments of the present disclosure.

FIG. 7 illustrates a simplified cross-sectional view of another LDMOS device having a split-gate structure in accordance with various embodiments of the present disclosure. The LDMOS device 700 shown in FIG. 7 is similar to the LDMOS device 300 shown in FIG. 3 except that the LOCOS structure is replaced by a high voltage oxide region 132.

As shown in FIG. 7, the gate dielectric layer 134 extends from an edge of the source region 114 to a sidewall of the high voltage oxide region 132. The first gate 124 covers a top surface of the gate dielectric layer 134 and a lower portion of the sidewall of the high voltage oxide region 132. The second gate 126 fully covers a top surface of the high voltage oxide region 132.

The LDMOS device having a high voltage oxide region for improving the breakdown voltage is well known in the art, hence is not discussed again herein. The LDMOS device 700 shown in FIG. 7 may be used in medium voltage applications such as 24 V applications.

Figure 8:
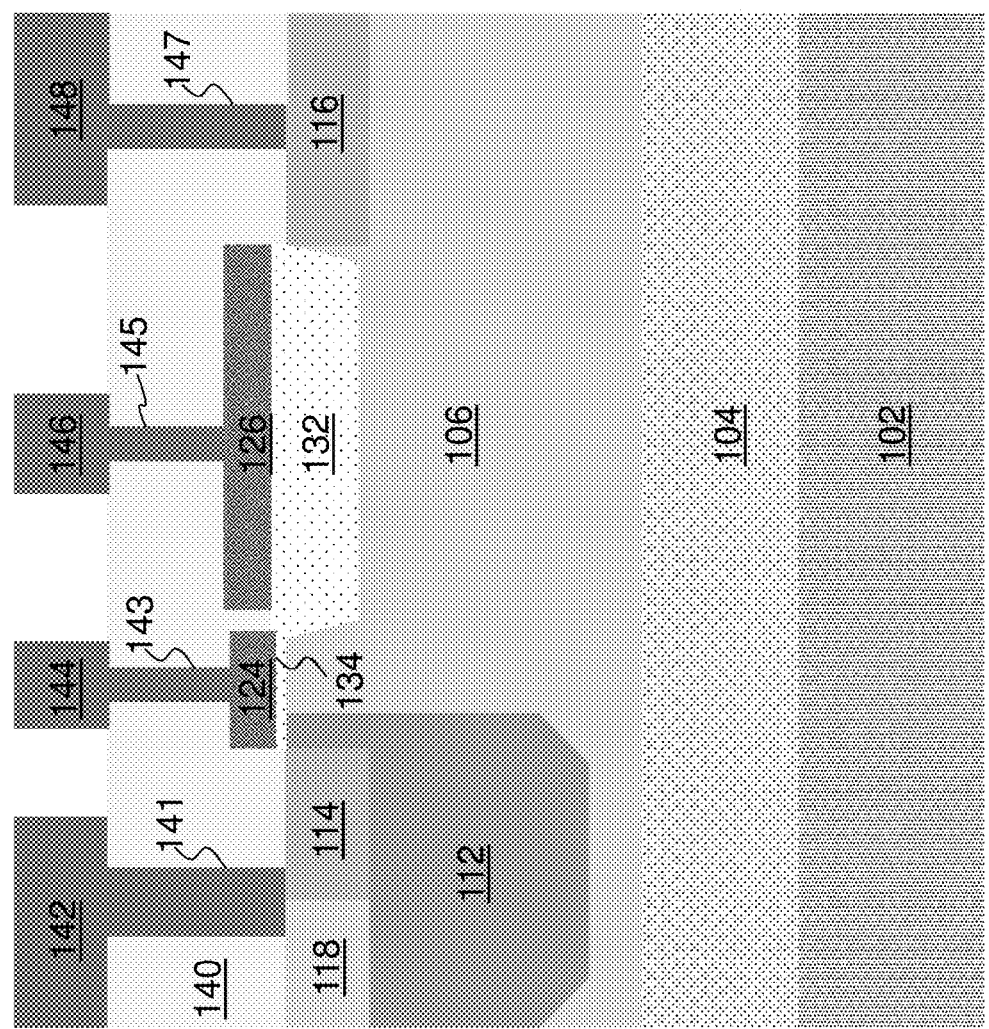
FIG. 8 illustrates a simplified cross-sectional view of another LDMOS device having a split-gate structure in accordance with various embodiments of the present disclosure.

FIG. 8 illustrates a simplified cross-sectional view of another LDMOS device having a split-gate structure in accordance with various embodiments of the present disclosure. The LDMOS device 800 shown in FIG. 8 is similar to the LDMOS device 300 shown in FIG. 3 except that the LOCOS structure is replaced by a shallow trench isolation (STI) region 132.

As shown in FIG. 8, the gate dielectric layer 134 extends from an edge of the source region 114 to a sidewall of the STI region 132. The first gate 124 covers a top surface of the gate dielectric layer 134. The second gate 126 partially covers a top surface of the STI region 132.

The LDMOS device with the STI region for improving the breakdown voltage is well known in the art, hence is not discussed again herein. The LDMOS device 800 shown in FIG. 8 may be used in medium voltage applications such as 24 V applications.

Figure 9:
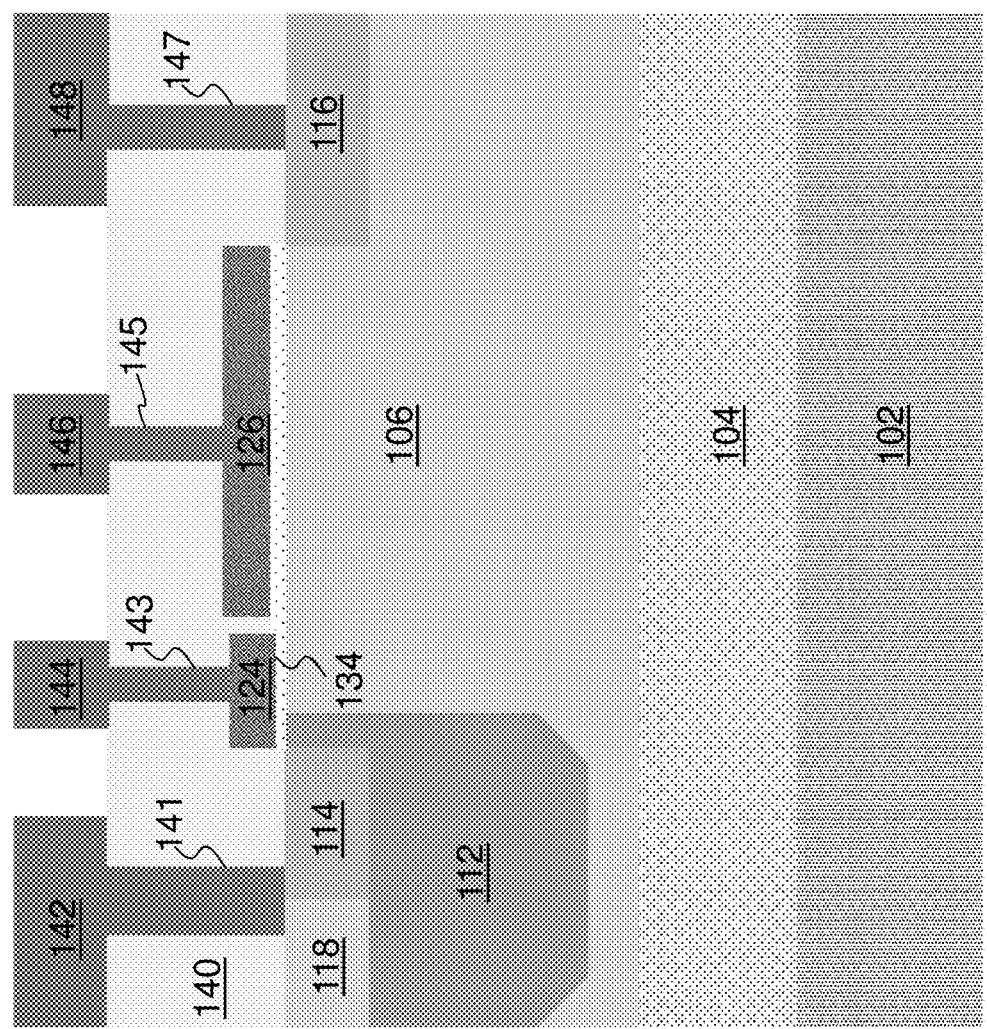
FIG. 9 illustrates a simplified cross-sectional view of another LDMOS device having a split-gate structure in accordance with various embodiments of the present disclosure.

FIG. 9 illustrates a simplified cross-sectional view of another LDMOS device having a split-gate structure in accordance with various embodiments of the present disclosure. The LDMOS device 900 shown in FIG. 9 is similar to the LDMOS device 700 shown in FIG. 7 except that the LDMOS device 900 does not include a high voltage oxide region. The LDMOS device 900 shown in FIG. 9 may be used in medium voltage applications such as 12 V applications.

Figure 10:
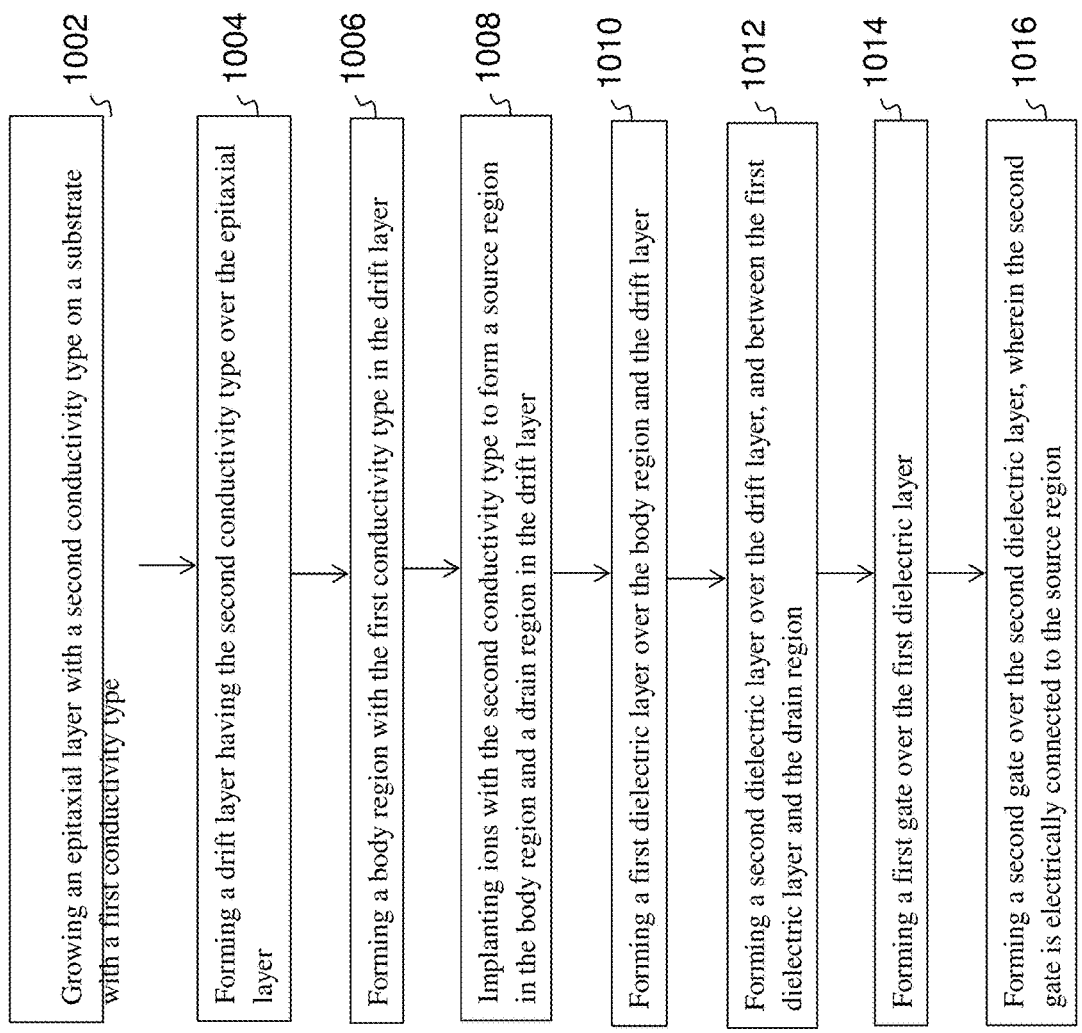
FIG. 10 illustrates a flow chart of a method for forming the LDMOS device shown in FIG. 3 in accordance with various embodiments of the present disclosure.

FIG. 10 illustrates a flow chart of a method for forming the LDMOS device shown in FIG. 3 in accordance with various embodiments of the present disclosure. This flowchart shown in FIG. 10 is merely an example, which should not unduly limit the scope of the claims. One of ordinary skill in the art would recognize many variations, alternatives, and modifications. For example, various steps illustrated in FIG. 10 may be added, removed, replaced, rearranged and repeated.

An LDMOS device comprises a first drain/source region and a second drain/source region formed over a substrate. In some embodiments, the first drain/source region is a source region. The second drain/source region is a drain region. The LDMOS device further comprises a drift layer over the substrate, a body region formed in the drift layer, and a dielectric region formed over the substrate and between the first drain/source region and the second drain/source region.

The dielectric region comprises a first portion and a second portion. The first portion is over the body region and the drift layer. The second portion is over the drift layer. The second portion is between the first portion and the drain region. In some embodiments, the second portion is an LOCOS structure.

The LDMOS device further comprises a first gate and a second gate formed over the first portion and the second portion of the dielectric region, respectively. The first gate and the second gate are electrically isolated from each other. One of the first gate and the second gate is electrically connected to the first drain/source region. In some embodiments, the first gate is electrically connected to the first drain/source region.

At step 1002, an epitaxial layer (e.g., layer 104 shown in FIG. 3) with a second conductivity type is grown over a substrate (e.g., layer 102 shown in FIG. 3) with a first conductivity type. In some embodiments, the first conductivity is p-type, and the second conductivity is n-type.

At step 1004, a drift layer (e.g., layer 106 shown in FIG. 3) having the second conductivity type is formed over the epitaxial layer. At step 1006, a body region (e.g., region 112 shown in FIG. 3) with the first conductivity type is formed in the drift layer.

At step 1008, ions with the second conductivity type are implanted to form a source region (e.g., region 114 shown in FIG. 3) in the body region and a drain region (e.g., region 116 shown in FIG. 3) in the drift layer.

At step 1010, a first dielectric layer (e.g., layer 134 shown in FIG. 3) is formed over the body region and the drift layer. At step 1012, a second dielectric layer (e.g., layer 132 shown in FIG. 3) is formed over the drift layer, and between the first dielectric layer and the drain region.

At step 1014, a first gate (e.g., gate 124 shown in FIG. 3) is formed over the first dielectric layer. At step 1016, a second gate (e.g., gate 126 shown in FIG. 3) is formed over the second dielectric layer. The second gate is electrically connected to the source region.

The method further comprises forming a body contact of the first conductivity type in the body region, wherein the body contact and the source region are electrically connected to each other.

With reference to FIG. 3, the method further comprises forming the first dielectric layer from an edge of the source region to a sidewall of the second dielectric layer, and forming the first gate along the edge of the source region, wherein the first gate covers a top surface of the first dielectric layer and a lower portion of the sidewall of the second dielectric layer, and wherein the second gate partially covers a top surface of the second dielectric layer, and the second dielectric layer is a local oxidation of silicon (LOCOS) structure.

With reference to FIG. 6, the method further comprises forming the first dielectric layer from an edge of the source region to a sidewall of the second dielectric layer, and forming the first gate along the edge of the source region, wherein the first gate covers a top surface of the first dielectric layer and a lower portion of the sidewall of the second dielectric layer, and wherein the second gate fully covers a top surface of the second dielectric layer, and the second dielectric layer is an LOCOS structure.

With reference to FIG. 7, the method further comprises forming the first dielectric layer from an edge of the source region to a sidewall of the second dielectric layer, and forming the first gate along the edge of the source region, wherein the first gate covers a top surface of the first dielectric layer and a lower portion of the sidewall of the second dielectric layer, and wherein the second gate fully covers a top surface of the second dielectric layer, and the second dielectric layer is a high voltage oxide region.

With reference to FIG. 8, the method further comprises forming the first dielectric layer from an edge of the source region to a sidewall of the second dielectric layer, and forming the first gate along the edge of the source region, wherein the first gate covers a top surface of the first dielectric layer, and wherein the second gate partially covers a top surface of the second dielectric layer, and the second dielectric layer is a shallow trench isolation (STI) region.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An apparatus comprising:
a substrate of a first conductivity;
an extended drain region of a second conductivity formed over the substrate;
a body region of the first conductivity formed in the extended drain region;
a source region of the second conductivity formed in the body region;
a drain region of the second conductivity formed in the extended drain region;
a first dielectric layer formed over the body region and the extended drain region;
a second dielectric layer formed over the extended drain region, and between the first dielectric layer and the drain region;

a first gate formed over the first dielectric layer, wherein an edge of the first gate is aligned with an edge of the source region, and the first gate partially covers a sidewall of the second dielectric layer; and a second gate formed over the second dielectric layer, wherein the second gate is electrically connected to the source region, and wherein the second gate fully covers a top surface of the second dielectric layer, and wherein from a top view, a second gate contact is connected to a source contact through a conductive layer placed outside the extended drain region.

2. The apparatus of claim 1, further comprising:
a buried layer of the second conductivity between the substrate and the extended drain region.

3. The apparatus of claim 1, further comprising:
a body contact of the first conductivity formed in the body region, wherein the body contact and the source region are electrically connected to each other.

4. The apparatus of claim 1, wherein:
the first conductivity is p-type; and
the second conductivity is n-type.

5. The apparatus of claim 1, wherein:
the second dielectric layer is a local oxidation of silicon (LOCOS) structure.

6. The apparatus of claim 1, wherein:
the second dielectric layer is a high voltage oxide region.

7. A device comprising:
a first drain/source region and a second drain/source region formed over a substrate;
an extended drain region formed over the substrate;
a dielectric region formed over the substrate and between the first drain/source region and the second drain/source region; and
a first gate and a second gate formed over the dielectric region, wherein:
the dielectric region comprises a first planar surface, a second planar surface and a sidewall connected between the first planar surface and the second planar surface;
an edge of the first gate is aligned with an edge of the first drain/source region, and the first gate partially covers the sidewall of the dielectric region;
the second gate fully covers the second planar surface;
the first gate and the second gate are electrically isolated from each other; and
from a top view, one of the first gate and the second gate is electrically connected to the first drain/source region through a conductive layer placed outside the extended drain region.

8. The device of claim 7, further comprising:
a body region in the extended drain region, wherein the first drain/source region is a source region formed in the body region and the second drain/source region is a drain region formed in the extended drain region; and
a body contact formed in the body region, wherein the body contact and the source region are electrically connected to each other.

9. The device of claim 8, wherein the dielectric region comprises:
a first portion over the body region and the drift layer; and
a second portion over the drift layer, and between the first portion and the drain region, and wherein the second portion is an LOCOS structure.

10. The device of claim 8, wherein the dielectric region comprises:
a first portion over the body region and the drift layer; and
a second portion over the drift layer, and between the first portion and the drain region, and wherein the second portion is a high voltage oxide region.

11. The device of claim 7, wherein:
the first drain/source region is a source region;
the second drain/source region is a drain region; and
the second gate is electrically connected to the source region.

* * * * *